US006787291B2

(12) United States Patent
Nagase et al.

(10) Patent No.: US 6,787,291 B2
(45) Date of Patent: Sep. 7, 2004

(54) DIRECTLY IMAGEABLE PLANOGRAPHIC PRINTING PLATE AND PRODUCTION METHOD THEREOF

(75) Inventors: Kimikazu Nagase, Shiga (JP); Kazuki Goto, Shiga (JP); Ken Kawamura, Shiga (JP); Kunitaka Fujiyoshi, Shiga (JP)

(73) Assignee: Toray Industries, Inc., Tokyo (JP)

( * ) Notice: Subject to any disclaimer, the term of this patent is extended or adjusted under 35 U.S.C. 154(b) by 282 days.

(21) Appl. No.: 09/825,931

(22) Filed: Apr. 5, 2001

(65) Prior Publication Data

US 2002/0045131 A1 Apr. 18, 2002

(30) Foreign Application Priority Data

Apr. 6, 2000 (JP) ....................................... 2000-104334
Apr. 28, 2000 (JP) ....................................... 2000-128758

(51) Int. Cl.[7] ................................................. G03F 7/11

(52) U.S. Cl. ....................... 430/292; 430/302; 430/303; 430/309; 430/273.1; 430/272.1; 430/944; 430/945

(58) Field of Search ................................ 430/292, 302, 430/303, 309, 273.1, 272.1, 944, 945

(56) References Cited

U.S. PATENT DOCUMENTS

| | | | | | |
|---|---|---|---|---|---|
| 3,901,706 | A | * | 8/1975 | Tsuboi et al. | 430/205 |
| 4,118,229 | A | | 10/1978 | Stromberger-D'Alton-Rauch et al. | |
| 4,769,308 | A | | 9/1988 | Hiruma et al. | |
| 4,863,831 | A | | 9/1989 | Hiruma et al. | |
| 4,959,296 | A | * | 9/1990 | Yoshida et al. | 430/302 |
| 5,491,046 | A | | 2/1996 | DeBoer et al. | |
| 5,773,187 | A | | 6/1998 | Gries et al. | |
| 5,786,125 | A | | 7/1998 | Tsuchiya et al. | |
| 5,849,464 | A | | 12/1998 | Yokoya et al. | |
| 5,871,883 | A | | 2/1999 | Hirano et al. | |
| 5,919,600 | A | | 7/1999 | Huang et al. | |
| 5,958,652 | A | | 9/1999 | Suezawa et al. | |
| 6,096,476 | A | * | 8/2000 | Yanagida et al. | 430/270.1 |
| 6,194,122 | B1 | * | 2/2001 | Ichikawa et al. | 430/272.1 |
| 6,284,433 | B1 | * | 9/2001 | Ichikawa et al. | 430/303 |

FOREIGN PATENT DOCUMENTS

| | | | |
|---|---|---|---|
| EP | 0 802 067 | | 5/1997 |
| EP | 897795 | * | 2/1999 |
| EP | 897 795 A | | 2/1999 |
| EP | 914 942 A | | 5/1999 |
| EP | 0 914 942 | | 5/1999 |
| EP | 1038669 | * | 9/2000 |
| JP | 4-318552 | | 11/1992 |
| JP | 4-333851 | | 11/1992 |
| JP | 10329443 A | | 12/1998 |
| JP | 11-227352 | * | 8/1999 |
| JP | 11-227353 | | 8/1999 |
| JP | 11-277927 | | 10/1999 |
| JP | 2000-275824 | * | 10/2000 |
| WO | WO 97/39894 | | 10/1997 |

OTHER PUBLICATIONS

Koerner von Gustorf CA 83:97425, abstract of Angew. Chem (1975), 87(9), pp. 300–309, from Chemical Abstracts, ACS, on line File CAPLUS.

Fukuda et al., CA 103:150749, abstract of Int. J. Mass Spectrom, Ion Processes (1985), 65(3), 321–8, from Chemical Abstracts, ACS on line, File CAPLUS.

* cited by examiner

*Primary Examiner*—Mark F. Huff
*Assistant Examiner*—Amanda C Walke
(74) *Attorney, Agent, or Firm*—Morrison & Foerster LLP

(57) ABSTRACT

A directly imageable planographic printing plate that is high in image productivity and easy to check is produced by using a directly imageable planographic printing plate that comprises at least a substrate, a thermo-sensitive layer and a ink-repelling layer in this order, wherein the thermo-sensitive layer in the printing area contains a dye that has an absorption maximum in the range of 400 nm to 700 nm, and the difference between the reflected absorption of the non-printing area and the reflected absorption of the printing area, observed at the absorption maximum wavelength of the dye, is not less than 0.3 and not more than 2.0.

13 Claims, No Drawings

DIRECTLY IMAGEABLE PLANOGRAPHIC PRINTING PLATE AND PRODUCTION METHOD THEREOF

BACKGROUND OF THE INVENTION

The present invention relates to a directly imageable planographic printing plate produced by using laser beam for direct plate making. In particular, this invention serves effectively to produce a directly imageable waterless planographic printing plate that makes it possible to perform printing without dampening water.

The so-called directly imageable plate making, which produces an offset plate directly from a block copy without the need of using film for plate making, has many good features such as simplicity to eliminate the need of expertise, rapidity to produce a printing plate quickly, and rationality to permit selection of a desirable system from a wide range of printers depending on the required quality and available cost. With such good features, this method has been in wider use in the fields of general offset printing and flexographic printing as well as small offset printing. Recently, in particular, various new directly imageable planographic printing plates have been developed in response to the rapidly increasing availability of improved output systems including pre-press systems, image setters, and laser beam printers. Directly imageable planographic printing plates can be divided into some groups in terms of the mechanism used for plate making. Thus, they may use laser beam irradiation, thermal heads for imaging, pin electrodes for partial application of voltage, or ink-jet printing to form an ink-repelling layer or an ink-holding layer. Among others, the use of laser beam permits an enhanced definition and increased plate making speed, resulting in the availability of a variety of products of this type.

Laser-imaging type printing plates are further divided into two groups: photon type that use a photoreaction and thermal type that use photothermal conversion to cause a thermal reaction. The thermal type products, in particular, are currently becoming the mainstream as a result of rapid improvement of semiconductor laser generators to be used as light source.

Different methods have been proposed to provide thermal-type planographic printing plates, particularly for waterless printing which does not need dampening water to be fed during the printing process. However, they all have different problems.

Some patents such as U.S. Pat. Nos. 5,339,737, 5,353,705 and EP0580393 have disclosed inventions relating to methods for producing a printing plate based on abrasion of a thermo-sensitive layer. Although they are advantageous in terms of simple developing operations, they need high laser output for the abrasion of the thermo-sensitive layer, and gas and other by-products of abrasion can have adverse effect on the optical system. Furthermore, additional operations are required for removing abrasion residue, and it is difficult to reproduce fine halftone dots.

A new type of printing plates in which the thermo-sensitive layer remain have been developed, as proposed in EP0914942 for example. Such inventions have provided directly imageable waterless planographic printing plates that serve for the production of high quality prints, which is one of the most important features of waterless printing, without having adverse effect on the optical system. These printing plates, however, contain a thermo-sensitive layer remaining in both the laser-irradiated and non-irradiated portions, leading to problems with difficult plate checking due to low contrast between the laser-irradiated and non-irradiated portions when observed visually. Thus there are difficulties in performing checking during the process after the preparation of a printing plate until the start of printing, and in allowing a plate mounted on the press to be checked during printing. Such checking is intended to confirm, prior to or during printing, that the printing plate has been prepared as required. Visual observation is performed for this confirmation. By this plate checking, mistakes associated with data transfer from computers to the process machine and mistakes during the plate making can be eliminated to prevent inferior prints from being produced due to such mistakes.

SUMMARY OF THE INVENTION

The present invention comprises the following.

A method of producing a directly imageable planographic printing plate that comprises;

applying laser beam to a directly imageable planographic printing plate precursor comprising at least a substrate, a thermo-sensitive layer and a ink-repelling layer in this order, removing the ink-repelling layer from the laser-irradiated portion, and dyeing, with a dyeing solution, of the printing area which is free of said ink-repelling layer, wherein the difference between the reflected absorption of the non-printing area which holds the ink-repelling layer and the reflected absorption of said printing area, observed after dyeing at the absorption maximum wavelength of the dye in said dyeing solution, is not less than 0.3 and not more than 2.0.

A directly imageable planographic printing plate precursor comprising at least a substrate, a thermo-sensitive layer and a ink-repelling layer in this order, wherein the ultraviolet absorption spectrum observed by the reflection method has the following features:

(1) the main peak in the ultraviolet absorption spectrum exists between 700 nm and 1,200 nm, and (2) the ratio A/B of the absorbance at 830 nm (A) to the absorbance at 650 nm (B) is not less than 1.5.

A directly imageable planographic printing plate precursor comprising at least a substrate, a thermo-sensitive layer and a ink-repelling layer in this order, wherein the ultraviolet absorption spectrum observed by the transmission method has the following features:

(1) the main peak in the ultraviolet absorption spectrum exists between 700 nm and 1,200 nm, and (2) the ratio A/B of the absorbance at 830 nm (A) and the absorbance at 650 nm (B) is not less than 3.0.

A directly imageable planographic printing plate comprising at least a substrate, a thermo-sensitive layer and a ink-repelling layer in this order, wherein the ultraviolet absorption spectrum observed by the reflection method has the following features:

(1) the main peak in the ultraviolet absorption spectrum exists between 700 nm and 1,200 nm, and (2) the ratio A/B of the absorbance at 830 nm (A) to the absorbance at 650 nm (B) is not less than 1.5.

A directly imageable planographic printing plate comprising at least a substrate, a thermo-sensitive layer and a ink-repelling layer in this order, wherein the ultraviolet absorption spectrum observed by the transmission method has the following features:

(1) the main peak in the ultraviolet absorption spectrum exists between 700 nm and 1,200 nm, and (2) the ratio A/B of the absorbance at 830 nm (A) to the absorbance at 650 nm (B) is not less than 3.0.

A directly imageable planographic printing plate comprising at least a substrate, a thermo-sensitive layer and a ink-repelling layer in this order, wherein the thermo-sensitive layer in the printing area contains a dye that has an absorption maximum in the range of 400 nm to 700 nm, and the difference between the reflected absorption of the non-printing area and the reflected absorption of the printing area, observed at the absorption maximum wavelength of the dye, is not less than 0.3 and not more than 2.0.

The present invention serves to produce a directly imageable planographic printing plate that has such good features as high image reproductivity and easy plate checking operation.

DESIRABLE MODES FOR CARRYING OUT THE INVENTION

The present invention is described in detail below.

The directly imageable planographic printing plate production method of the invention is characterized in that laser beam is applied to a directly imageable planographic printing plate material comprising at least a substrate, a thermo-sensitive layer and a ink-repelling layer in this order, to remove the ink-repelling layer in the laser-irradiated portion, followed by dyeing, with a dyeing solution, the printing area which is free of said ink-repelling layer. Furthermore, the invention is also characterized in that the difference between the reflected absorption of the non-printing area and the reflected absorption of the printing area, observed after dyeing of the printing plate at the absorption maximum of the dye in the dyeing solution, is not less than 0.3 and not more than 2.0. Here, the non-printing area refers to the area where the ink-repelling layer has not been removed whereas the printing area refers to the area where the ink-repelling layer has been removed.

The directly imageable planographic printing plate production method of the invention is characterized in that the thermo-sensitive layer of the printing area contains a dye that has an absorption maximum in the visible light range (400 nm to 700 nm), and that the difference between the reflected absorption of the non-printing area and the reflected absorption of the printing area, observed at the absorption maximum of the dye, is not less than 0.3 and not more than 2.0.

The fact that dyeing the developed printing area is effective for enhancing the easiness of plate check is disclosed in EP0914942 for example. With conventional plates such as described in EP0914942, however, desired easiness of plate check cannot be achieved even if the plates are dyed. The present inventors have carried out earnest studies and revealed that desired easiness of plate check can be achieved if the difference between the reflected absorption of the non-printing area and the reflected absorption of the printing area, observed at the absorption maximum of the dye used for the dyeing, is not less than 0.3. Coloring is easier if the difference in absorption is not more than 2.0. The difference in reflected absorption should preferably be not less than 0.5 and not more than 1.5. For easiness of visual observation, the absorption maximum of said dye should preferably be in the visible light range (400 nm to 700 nm). It is more preferred for the absorption maximum of said dye to be in the range of 500 nm to 650 nm to further enhance the easiness of visual observation and plate check.

The reflected absorption can be measured by using an integrating sphere with a spectrophotometer for ultraviolet and visible region. Specifically, Hitachi Ltd. U-3210 ultraviolet-visible spectrophotometer, equipped with an integrating sphere, may be used for the measurement.

A method to measure the reflected absorption of the printing area is to prepare a sample containing only a printing area and measure its reflected absorption with an ultraviolet-visible spectrophotometer. To enhance the accuracy of measurement, the sample should be irradiated uniformly with laser beam to remove the ink-repelling layer completely from a 1 cm×1 cm or larger portion of the sample. A method to measure the reflected absorption of the non-printing area is to prepare a sample containing only a non-printing area, as in the above-mentioned case, and measure its reflected absorption with an ultraviolet-visible spectrophotometer.

Useful dyes that can be used in a dyeing solution for the invention include basic dyes, acid dyes, direct dyes, disperse dyes, and reactive dyes, which may be used singly or in combination. Among others, water-soluble basic and acid dyes are preferred. When two or more dyes are used in combination, the absorption wavelength of the dye with the largest reflected absorption is taken as the absorption maximum wavelength of the dyes.

Useful basic dyes include “Crystal Violet”, “Ethyl Violet”, “Victoria Pure Blue”, “Victoria Blue”, “Methyl Violet”, “Diabacis Magenta” (Mitsubishi Chemical Corporation), “Aizen Basic Cyanine 6GH” (Hodogaya Chemical Co., Ltd.), “Primocyanine BX Conc.” (Sumitomo Chemical Co., Ltd.), “Astrazon Blue G” (Farbenfarriken Bayer), “Diacryl Supra Brilliant 2B” (Mitsubishi Chemical Corporation), “Aizen Cathilon Turquoise Blue LH” (Hodogaya Chemical Co., Ltd. ), “Aizen Diamond Green GH” (Hodogaya Chemical Co., Ltd.), and “Aizen Malachite Green” (Hodogaya Chemical Co., Ltd.)

Useful acid dyes include “Acid Violet 5B” (Hodogaya Chemical Co., Ltd.), “Kiton Blue A” (CIBA), “Patent Blue AF” (BASF), “Rakuto Brilliant Blue FCF” (Rakuto Kagaku Kogyo Co., Lid.), “Brilliant Aid Blue R” (Geigy), “Kayanol Canine 6B” (Nippon Kayaku Co., Ltd.), “Supranol Cyanine G” (Farbenfarriken Bayer), “Orient Soluble Blue OBB” (Oriento Kagaku Kogyo Co., Ltd.), “Acid Brilliant Blue 5G” (Chugai Kasei Co., Ltd.), “Acid Brilliant Blue FFR” (Chugai Kasei Co., Ltd.), “Acid Green GBH” (Takaoka Kagaku Kogyo Co., Ltd.), and “Acid Brilliant Milling Green B” (Hodogaya Chemical Co., Ltd.).

The content of these dyes in the dyeing solution used should be in the range of 0.01 wt % to 10 wt %, preferably in the range of 0.1 wt % to 5 wt %.

Useful solvents that can be used in a dyeing solution for the invention include water alcohols, glycols, glycol monoalkylethers, and glycol dialkylethers, which may be used singly or in combination. Glycols, glycol monoalkylethers, and glycol dialkylethers can work as processing solvent, and therefore, if part of the silicone rubber layer cannot removed by development and remains in the laser-irradiated portion after the development process, development of the portion can be completed in an after-treatment process.

Other agents such as dyeing auxiliaries, organic acids, inorganic acids, antifoaming agents, plasticizers, and surface active agents may be added as necessary.

The temperature of a dyeing solution may be set appropriately in each case, but should preferably in the range of 10° C. to 50° C. The developing solution may contain dyes as mentioned above to allow development and dyeing of the printing area to be carried out simultaneously.

The printing area where the ink-repelling layer has been removed can be dyed by rubbing the plate surface with a piece of nonwoven fabric, absorbent cotton, cloth, or sponge containing such a dyeing solution, or by showering the dyeing solution over the surface followed by rubbing it with a brush.

Such a method that use a dyeing solution is advantageous as desired material can be selected from a wide range of available ones and an adequate contrast between the printing and non-printing areas can be achieved easily without fail.

The present inventors have carried out earnest studies on the factors in the fail by conventional printing plates in achieving a large difference in reflected absorption as described above, and revealed that a major factor is the relation between the absorption characteristics of the dye used for the dyeing and those of the material of the printing plate.

A printing plate before dyeing or a precursor thereof should be such that when measured with the reflection method, (1) the printing plate gives an ultraviolet absorption spectrum containing a main peak in the range of 700 nm to 1200 nm, and (2) the ratio A/B of the absorbance at 830 nm (A) to that at 650nm (B) is not less than 1.5. If the transmission method is used instead for observing said ultraviolet absorption spectrum, the ratio in absorbance, A/B, should be not less than 3.0, preferably not less than 5.

A printing plate precursor as proposed in the invention is suited for plate making with semiconductor laser, and therefore, it gives an absorption spectrum containing a main peak in the range of 700 nm to 1,200 nm in order to be sensitive to semiconductor laser beam in the near infrared region.

To achieve easiness of plate check and high image reproductivity simultaneously, the ratio A/B of the absorbance at 830 nm (A) to that at 650nm (B) in the spectrum should be above a certain level.

The reflection method and the transmission method are available for observing the ultraviolet absorption spectrum. It is preferred to use the reflection method for a printing plate comprising a substrate of a non-UV-transmitting material such as aluminum and to use the transmission method for a printing plate comprising a substrate of a UV-transmitting material such as polyethylene terephthalate.

By achieving an absorbance ratio (A/B) in the range described above, it is possible to produce a printing plate that is low in the absorption in the visible light range (400 nm to 700 nm) while maintaining a required sensitivity to semiconductor laser beam in the near infrared range. By dyeing such a printing plate with a dyeing method as described above, furthermore, it is possible to produce a printing plate in which the difference between the reflected absorption of the non-printing area and the that of the printing area in the range described above, permitting an enhanced easiness of plate check.

Thus, for a printing plate before dyeing or a precursor thereof, the maximum absorbance in the ultraviolet absorption spectrum in the range of 400 nm to 700 nm should be not more than 2.

To produce a directly imageable planographic printing plate that has such ultraviolet absorption properties as described above, it is preferred to prepare a thermo-sensitive layer that contains dyes, pigments, etc. , with specific absorption properties.

In the thermo-sensitive layer of this invention, the surface in the laser-irradiated portion has an increased solubility to organic solvents and an increased expansiveness, allowing the ink-repelling layer to be removed by development while leaving the thermo-sensitive layer unremoved.

Dyes and pigments that can be used effectively in the thermo-sensitive layer of the invention include such dyes as cyanine dyes, polymethine dyes, phthalocyanine dyes, and naphthalocyanine dyes, and such dyes and pigments as dithiol metal complex compounds, piazrenium compounds, squalirium compounds, croconium compounds, azo compounds, bisazo compounds, bisazo stilbene compounds, naphthoquinone compounds, anthraquinone compounds, perylene compounds, indoaniline compounds, benzothiopyran compounds, spiropyran compounds, nigrosine compounds, thioindigo compounds, nitroso compounds, quinoline compounds, and fulgide compounds, said dyes and pigments (1) giving an ultraviolet absorption spectrum with the main peak in the range of 700 nm to 1,200 nm, and (2) having a ratio A/B of the absorbance at 830 nm (A) to the absorbance at 650 nm (B) in the spectrum above a certain level. Since the peak wavelength often suffers a shift due to interactions between dyes/pigments and other components of the thermo-sensitive layer, printing plate samples should be prepared, and dyes and pigments that meet the above requirements should be selected based on the results.

Some of such desirable dyes are listed below.

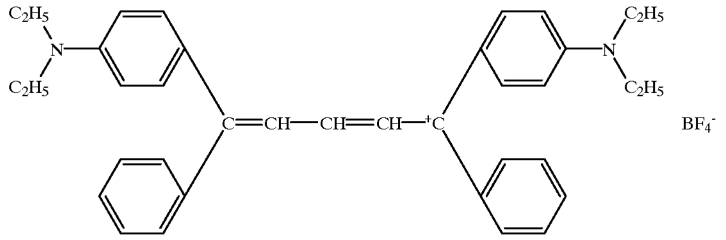

-continued
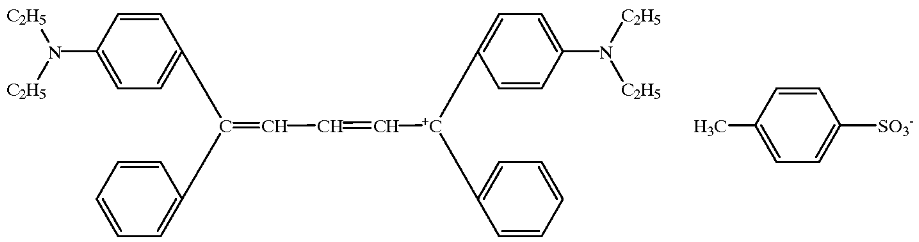
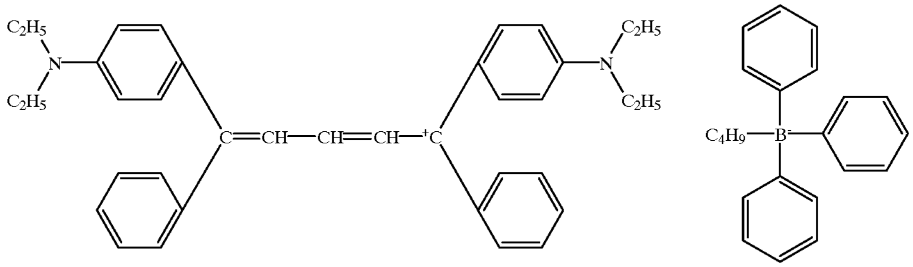
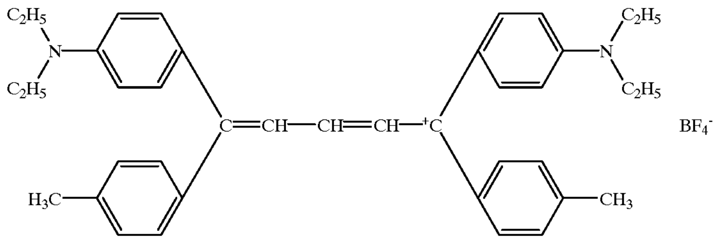
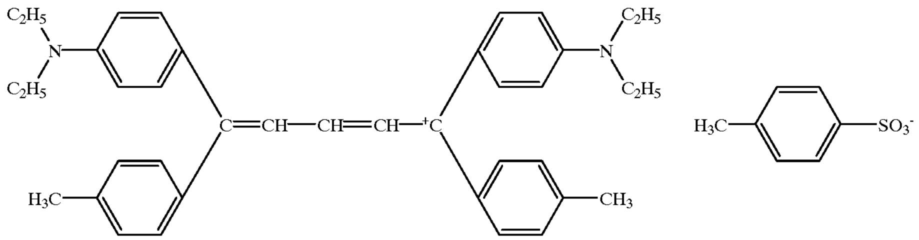
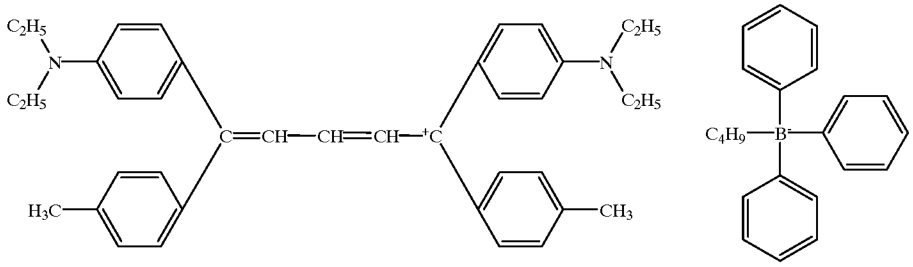
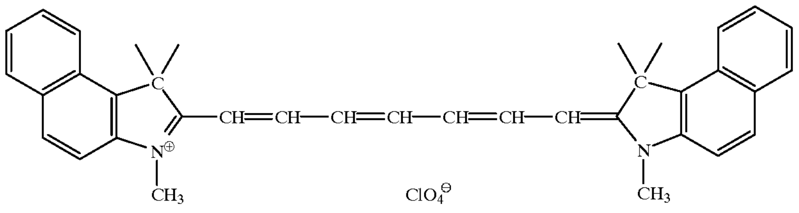

-continued
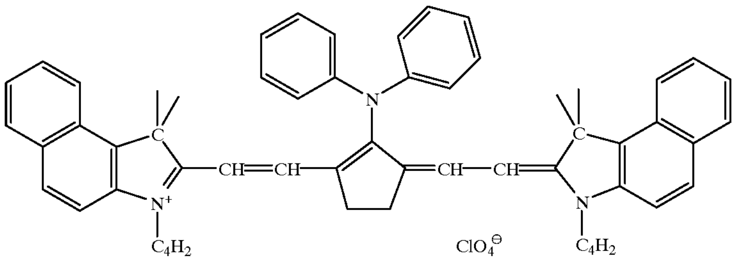
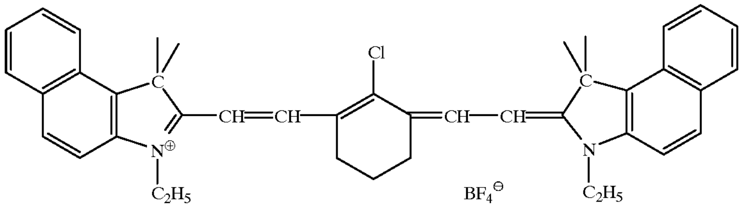
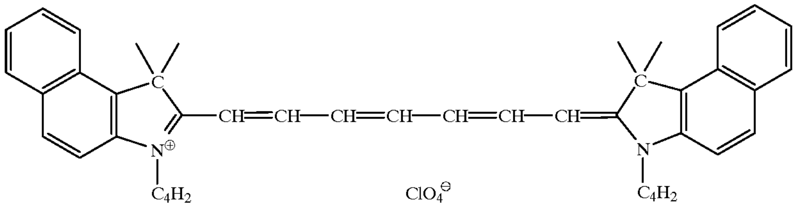
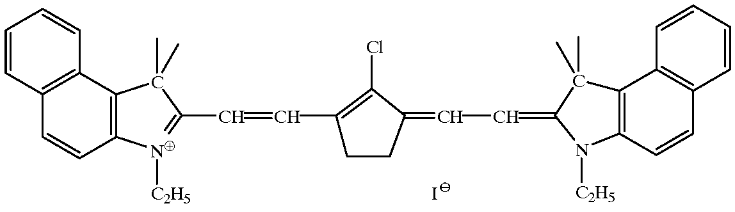
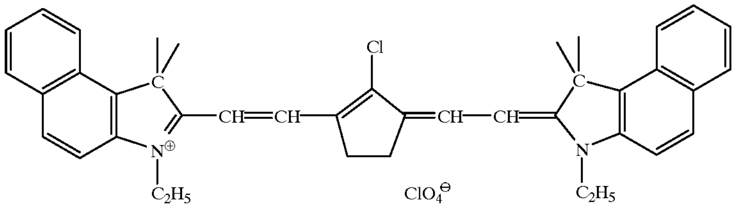
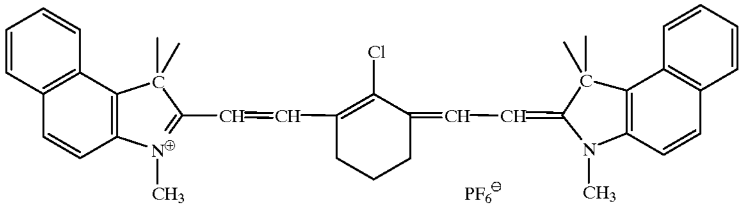
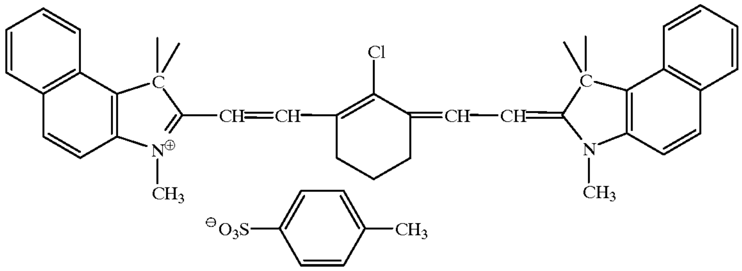

-continued
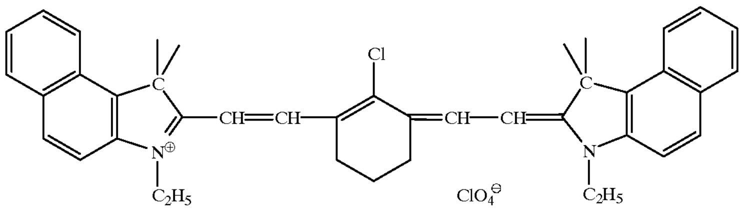
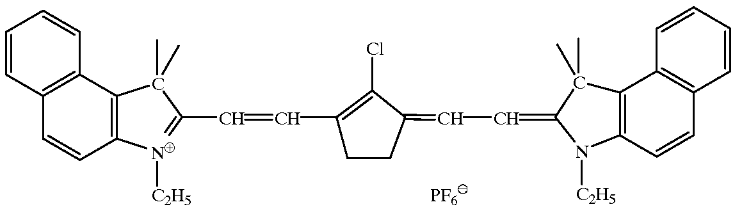
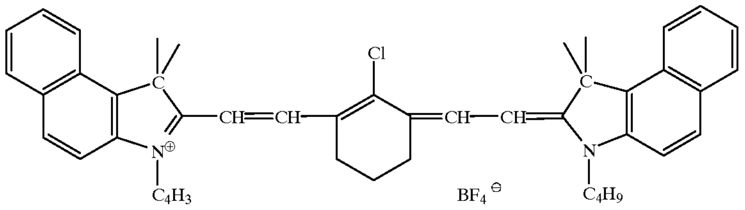
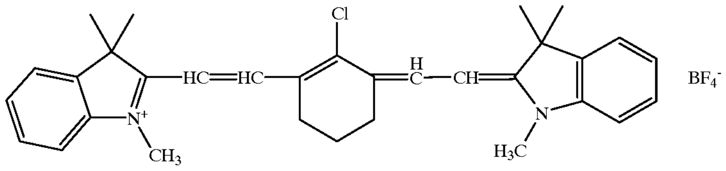
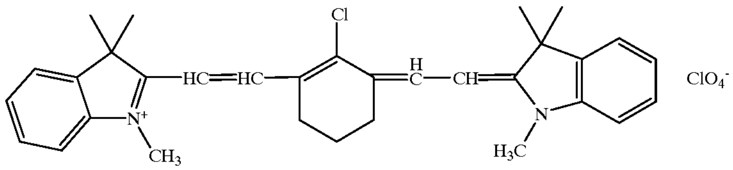
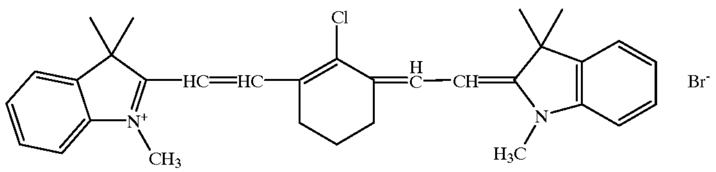
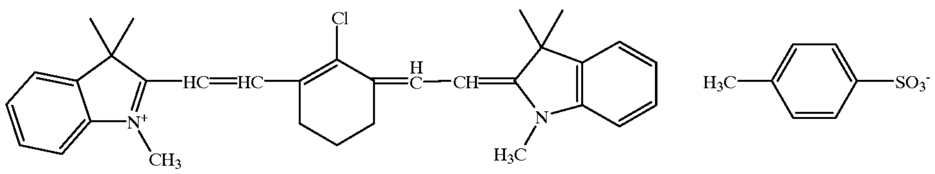
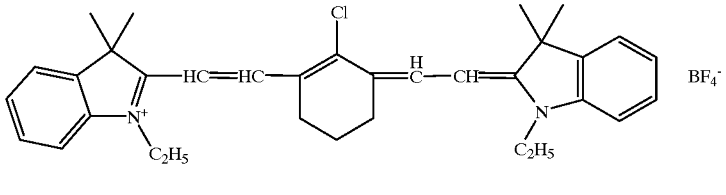

-continued

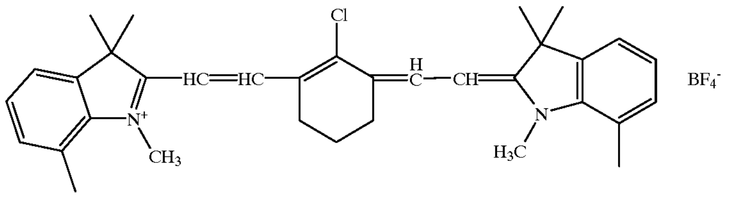

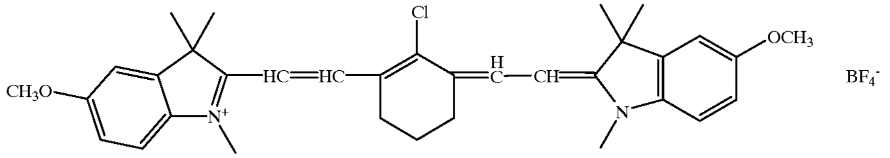

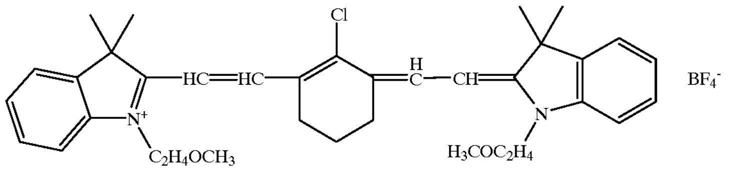

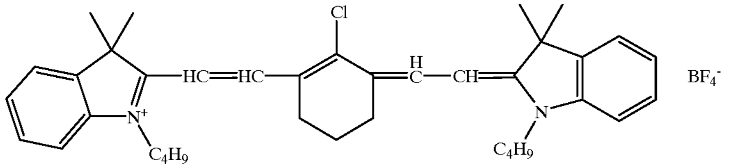

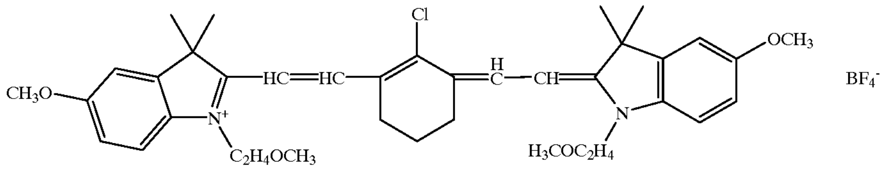

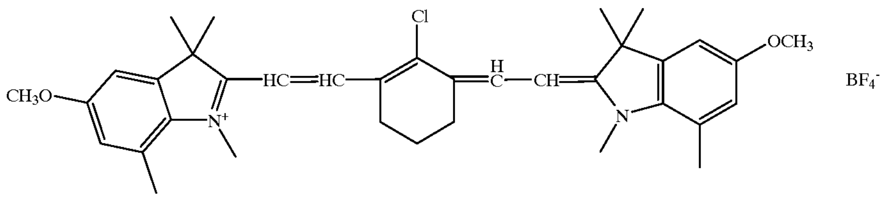

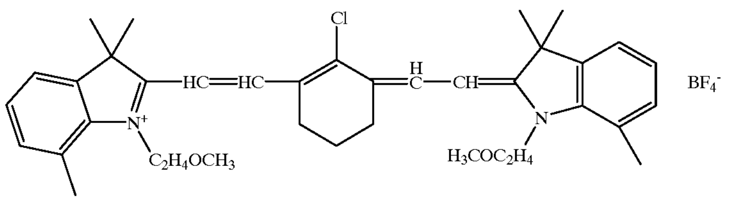

Commercially available dyes that are preferred include "KAYASORB" series CY-10, CY-17, CY-5, CY-4, CY-2, CY-20, CY-30, and IRG-002 (Nippon Kayaku Co., Ltd.); YKR-4010, YKR-3030, YKR-3070, YKR-2900, SIR-159, PA-1005, SIR-128, YKR-2080, and PA-1006 (Yamamoto Chemicals Inc.); "PROJET" 825LDI, "PROJET" 830NP, S174963, and S174270 (Avecia Limited); NK-2014, NK-2911, NK-2912, NK-4432, NK-4474, NK-4489, NK-4680, NK-4776, NK-5020, NK-5036, and NK-5042 (Hayashibara Seibutsukagaku Kenkyusho Co., Ltd); IR2T, and IR3T (Showa Denko K. K.); "EXCOLOR" 801K, IR-1, IR-2, TX-EX-801B, and TX-EX-805K (Nippon Shokubai Co., Ltd.); CIR-1080 (Japan Carlit Co., Ltd.); IR98011, IR980301, IR980401, IR980402, IR980405, IR980406, and IR980504, (Yamada Chemical Co., Ltd.); "EPOLIGHT" V-149, V-129, V-63, III-184, III-192, IV-62B, IV-67, VI-19, and VI-148 (Epolin, Inc.)

The contents of such dyes should be in the range of 1 wt % to 40 wt %, preferably 5 wt % to 25 wt %, of the total components of the thermo-sensitive layer. A content of not less than 1 wt % is preferred to permit efficient imaging while dyes with a content of not more than 40% will not have adverse effect on the properties of the thermo-sensitive layer.

A thermo-sensitive layer to be used for the invention should contain resins that have active hydrogen groups as main components, and compounds that interact with such resins, in addition to such dyes as mentioned above.

Such resins having active hydrogen groups include novolak resins and resol resins produced by condensation reaction of such phenols as phenol, cresol, and xylenol, with formaldehyde, as well as phenol-furfural resins, furan resins, hydroxyl-containing urethane resins, p-hydroxystyrene copolymers, hydroxyethylmethacrylate copolymers, of which novolak resins are particularly preferred.

Said compounds that interact with resins include blocked isocyanate, epoxy-containing compounds, acrylate compounds, metal chelate compounds, aldehyde compounds, mercapto-containing compounds, alkoxysilyl compounds, amine compound, carboxylic acid, vinyl-containing compounds, allyl-containing compounds, diazonium salt, azido compounds, and hydrazine, as well as leuco dyes, and coumarin dyes, of which metal chelate compounds are particularly preferred.

Such metal chelate compounds include organic chelate compounds of Al, Ti, Mn, Fe, Co, Ni, Cu, Zn, Ge, In, Sn, Zr, Hf, etc., preferred ones being Ti, Zr, Hf, Sn, and In. The ligands should preferably be pentanedionates.

Preferred metal chelate compounds include, but not limited to, aluminum bis-ethylacetoacetate monoacetylacetonate, aluminum diacetylacetonate ethyl acetoacetate, aluminum monoacetylacetonate bis-propyl acetoacetate, aluminum monoacetylacetonate bisbutyl acetoacetate, aluminum monoacetylacetonate bishexyl acetoacetate, aluminum monoethyl acetoacetate bispropyl acetoacetonate, aluminum monoethyl acetoacetate bisbutyl acetoacetonate, aluminum monoethylacetoacetate bis-hexyl acetoacetonate, aluminum monoethylacetoacetate bisnonylacetoacetonate, aluminum dibutoxide monoacetoacetate, aluminum dipropoxide monoacetoacetate, aluminum butoxide monoethylacetoacetate, aluminum-s-butoxide bis(ethyl acetoacetate), aluminum di-s-butoxide ethylacetoacetate, aluminum-9-octadecenyl acetoacetate diisopropoxide, titanium allylacetoacetate triisopropoxide, titanium di-n-butoxide (bis-2,4-pentanedionate), titanium diisopropoxide (bis-2,4-pentanedionate), titanium diisopropoxide bis (tetramethylheptanedionate), titanium diisopropoxide bis (ethyl acetoacetate), titanium methacryloxyethylacetoacetate triisopropoxide, titanium oxide bis(pentanedionate), zirconium allylacetoacetate triisopropoxide, zirconium di-n-butoxide (bis-2,4-pentanedionate), zirconium diisopropoxide (bis-2,4-pentanedionate), zirconium diisopropoxide bis(tetramethylheptanedionate), zirconium diisopropoxide bis(ethylacetoacetate), zirconium methacrylicoxyethylacetoacetate triisopropoxide, zirconium butoxide (acetylacetate) (bisethylacetoacetate), and iron acetylacetonate.

These resins and compounds that interact with said resins contained in the thermo-sensitive layer should account for 20 wt % to 95 wt %, preferably 30 wt % to 70 wt %, of the total solid content of the thermo-sensitive layer. A content of not less than 20 wt % serves to prevent significant changes in the solubility and swelling ratio from being caused as a result of changes in the thermo-sensitive layer as it is involved in the image formation. On the other hand, if the content is not more than 95 wt %, the relative amount of the infrared-absorbing dyes are maintained to prevent troubles from being caused in image formation.

In addition, the thermo-sensitive layer may contain binder polymers, surface active agents, and other various additives. The content of such binders should be 5 wt % to 70 wt %, preferably 10 wt % to 50 wt %, of the total components of the thermo-sensitive layer. A content not less than 5 wt % serves to prevent deterioration in plate wear and coating properties of the paint used while the image reproductivity will not reduced if the content is not more than 70 wt %.

The thickness of the thermo-sensitive layer, in the form of coated film, should be 0.1 g/m$^2$ to 10 g/m$^2$, preferably 1 g/m$^2$ to 5 g/m$^2$, to ensure a high plate wear of the printing plate, rapid vaporization of solvents, and high productivity.

The transmittivity of the thermo-sensitive layer of the invention for light with the same wavelength as the laser beam used for the irradiation should be not less than 20%, preferably not less than 10%. A transmittivityof not less than 20% serves to reduce the total amount of light that pass through the thermo-sensitive layer to ensure effective reaction at the surface of the thermo-sensitive layer. Further, a reduction in the total amount of light that pass through the thermo-sensitive layer serves to prevent the excessive reaction in the thermo-sensitive layer from being caused by the energy reflected from below the thermo-sensitive layer. This facilitates maintaining the thermo-sensitive layer.

One of the features of the printing plate of the present invention is the use of an ink-repelling layer. The use of an ink-repelling layer serves to overcome such problems as variations in printing concentration due to non-uniform feeding of dampening water and adverse environmental effects of alcohol components in dampening water, which can have serious influence in conventional printing methods that use dampening water to form ink-repelling portions. Printing plates comprising a ink-repelling layer are particularly preferred for directly imageable planographic printing. The use of directly imageable planographic printing plates is advantageous in that management of printing plates can be performed on a computer, as compared to the conventional plate making method in which the plate is exposed to light through film. It is assumed here that high-quality prints are always obtained with high reproductivity, and variations in printing concentration due to non-uniform feeding of dampening water can cause a serious problem.

The ink-repelling layer of the invention should be made of silicone rubber from the viewpoint of image reproductivity, ink-repelling properties, and scratch resistance. Either addition-polymerized or condensation-polymerized silicone rubber layers may be used.

Said addition-polymerized silicone rubber layers may comprise polysiloxanes with carbon-carbon double bonds, and SiH-containing polysiloxanes, as well as reaction retarders for control of curing, and curing catalysts.

Preferred polysiloxanes with carbon-carbon double bonds include polysiloxanes that contain vinyl groups, preferably polysiloxanes that have vinyl groups at the molecular ends and/or in the principal chain, more preferably polysiloxanes that have vinyl groups at both molecular ends. Such compounds has a structure represented by the following general formula (I):

(I)

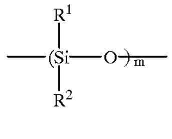

where m denotes an integer of 2 or larger, and R$^1$ and R$^2$, which may be the same or different, respectively denote a substituted or non-substituted alkyl group with 1–50 carbons, a substituted or non-substituted alkenyl group with 2–50 carbons, or a substituted or non-substituted aryl group with 4–50 carbons.

Not less than 50%, preferably not less than 80%, of all groups represented by R$^1$ and R$^2$ in formula (I) should be methyl from the viewpoint of the ink-repelling properties of the printing plate.

Vinyl-containing polysiloxanes with a molecular weight of several thousands to several hundreds of thousands can be used, but those with a weight-average molecular weight of 10,000 to 200,000, preferably 30,000 to 150,000, are preferred from the viewpoint of handling properties, plate's ink-repelling properties, and scratch resistance.

In particular, their polystyrene-based weight-average molecular weight (Mw) measured by gel permeation chromatography should be not less than 100,000, more preferably not less than 130,000.

Gel permeation chromatography (GPC) is a method for liquid chromatography that performs separation based on the difference in molecular size to determine the molecular weight distribution and average molecular weight of polymers. If sample solution is injected into a column filled with particulate gel that have pores of a similar size to the volume occupied by a polymer chain in a dilute solution, molecules with a higher molecular weight, i.e. those with a larger molecular size in the solution, permeate the gel more slowly from pores at the surface, and therefore they move faster through the column and are eluted more quickly than molecules with a lower molecular weight. This tendency is used to produce GPC chromatogram, and the curve in the chromatogram is analyzed by a specified procedure to determine the molecular weight distribution or the average molecular weight as required.

In the silicone rubber layer in a directly imageable waterless planographic printing plate, polysiloxanes with carbon-carbon double bonds are a very important factor that can largely affect its properties. A high scratch resistance can be achieved when the weight-average molecular weight is not less than 100,000.

In addition, the ratio of the weight-average molecular weight (Mw) to the number-average molecular weight (Mn) based on polystyrene, measured also by gel permeation chromatography, i.e. variance Mw/Mn, should be not more than 7, preferably not more than 6. A variance (Mw/Mn) of not more than 7 serves to eliminate low molecular weight components, leading to improved silicone rubber layer properties and a highly enhanced scratch resistance.

When development and dyeing of a directly imageable waterless planographic printing plate is performed by brushing in an automatic developing machine, adequate brushing of the silicone rubber layer including the non-printing area is necessary to achieve a high image reproductivity and good dyeing properties. Since a silicone rubber layer with a high scratch resistance can be produced by using a vinyl-containing polysiloxane with a weight-average molecular weight of not less than 100,000 and a variance of not more than 7, which serves to provide a highly practical printing plate that suffers little scratch on the silicone layer in the non-printing area while maintaining a high image reproductivity and good dyeing properties.

Said SiH-containing polysiloxanes include compounds that contain SiH groups in the molecular chain or at molecular ends.

The number of SiH groups in said SiH-containing polysiloxane should be not less than 2 per molecule, preferably not less than 3 per molecule. The content of said SiH-containing polysiloxane should be 3 wt % to 20 wt %, preferably 5 wt % to 15 wt %, of the total components of the silicone rubber layer. In terms of the ratio of quantity relative to polydimethylsiloxane, the mole ratio of the SiH group and the vinyl group in polydimethylsiloxane should be 1.5 to 30, preferably 10 to 20. If said mole ratio is not less than 1.5, it is possible to achieve sufficient curing of the silicone rubber layer, while said mole ratio is not more than 30, it is possible to prevent the rubber from becoming so brittle as to have adverse effect on the scratch resistance of the printing plate.

Said reaction retarders include nitrogen-containing compounds, phosphorus compounds, and unsaturated alcohols. In particular, alcohols containing acetylenic groups are preferred. The content of said reaction retarders should be 0.01 wt % to 10 wt %, preferably 1 wt % to 5 wt %, of the total components of the silicone rubber.

Said curing catalysts include Group III transition metal compounds, preferably platinum compounds such as platinum, platinum chloride, chloroplatinic acid, olefin-coordinated platinum, alcohol-modified complexes of platinum, and methylviny polysiloxane complexes of platinum. The content of such curing catalysts should be 0.01 wt % to 20 wt %, preferably 0.1 wt % to 10 wt %, as solid in the silicone rubber layer. If the content of curing catalysts is not less than 0.01%, the silicone rubber layer will be cured sufficiently, and good adhesion with the thermo-sensitive layer will be achieved. If the content is not more than 20%, on the other hand, catalysis will have no adverse effect on the pot life of the silicone rubber solution. The content of metals such as platinum in the total components of the silicone rubber layer should be 10 ppm to 1000 ppm, preferably 100 ppm to 500 ppm.

In addition to such components, the rubber may contain organo-polysiloxane that contains hydroxyl groups and silane/siloxane that contains hydrolyzable functional groups, which are components of condensation silicone rubber; fillers such as silica for increasing the rubber strength; and silane coupling agents, titanate coupling agents, and aluminum coupling agents for increasing the adhesion. Such silane coupling agents include alkoxysilanes, acetoxysilanes, and ketoximin silanes, of which vinyl-containing ones and ketoximin silanes are preferred.

Components of said condensation-polymerized silicone rubber include hydroxyl-containing polydimethylsiloxanes, cross-linking agents (deacetated, deoximated, dealcoholized, deaminated, deacetonated, deamidated, deaminoxylated, etc.) and curing catalysts.

Said hydroxyl-containing polydimethylsiloxanes may have hydroxyl groups at molecular ends and/or in the molecular chain, but those with hydroxyl groups at molecular ends are preferred. Their molecular weight should be from several thousands to several hundreds of thousands. Specifically, their weight-average molecular weight should be from 10,000 to 200,000, preferably from 30,000 to 150,000, from the viewpoint of handling properties of such silanes, and ink-repelling properties and scratch resistance of resulting plates.

Said cross-linking agents for condensation-polymerized silicone rubber layers include acetoxysilanes, alkoxysilanes, ketoximine silanes, and allyloxysilanes as expressed by the following general formula (I):

$$(R^1)_{4-n}SiXn \qquad (I)$$

where n denotes an integer from 2 to 4, $R^1$ denoting a substituted or non-substituted alkyl, alkenyl, or aryl group, or a group consisting of two or more of them, X denoting a halogen, alkoxy, acyloxyacyl, ketoximine, aminooxy, amide, or alkenyloxy functional group. In the above formula, n which denotes the number of hydrolysable groups should be 3 or 4.

Specifically, preferred compounds include methyl triacetoxysilanes, ethyl triacetoxysilanes, vinyl triacetoxysilanes, vinyl tri(methylethyl ketoximine) silanes, and tetra(methylethylketoximine)silanes.

The content of said cross-linking agents as represented by general formula (I) should be 1.5 wt % to 20 wt %, preferably 3 wt % to 10 wt %, of the total components of the silicone rubber layer. In terms of the ratio of quantity relative to polydimethylsiloxane, the mole ratio of functional group X to the hydroxyl group in polydimethylsiloxane should be 1.5 to 10.0. If the mole ratio is not less than 1.5, the silicone rubber solution will not cause gelation, and if it is not more than 10.0, said agents will not have adverse effect on the brittleness of the rubber or scratch resistance of resultant printing plates.

Said curing catalysts include acids, alkalis, amines, metal alkoxide, metal diketenate, and metal salts of organic acids, of which metal salts of organic acids, the metal being tin, lead, zinc, iron, cobalt, calcium, or manganese, are preferred. Such compounds include dibutyl tin diacetate, dibutyl tin dioctate, and dibutyl tin dilaurate. The content of such curing catalysts should be 0.01 wt % to 20 wt %, preferably 0.1 wt % to 10 wt %, as solid in the silicone rubber layer. If the content of the catalysts added is not less than 0.01 wt %, the silicone rubber layer will be cured sufficiently, and good adhesion with the thermo-sensitive layer will be achieved. If the content is not more than 20%, on the other hand, catalysis will have no adverse effect on the pot life of the silicone rubber solution.

The thickness of such a silicone rubber layer should be 0.5 $g/m^2$ to 20 $g/m^2$, preferably 1 $g/m^2$ to 4 $g/m^2$. If the layer thickness is not less than 0.5 $g/m^2$, ink-repelling properties, scratch resistance and printing wear will be developed stably in the resultant printing plate, while if it is not more than 20 $g/m^2$, good developing properties and ink mileage will be maintained.

Plate-like substrates with high dimensional stability are used for directly imageable planographic printing plates of the present invention. Such plate-like materials with high dimensional stability include paper; metals such as stainless steel and aluminum; plastics such as polyester, polyethylene, and polypropylene; and metal-laminated or metal-deposited paper or plastic sheets (the metal being aluminum etc.). Of these materials, aluminum plates are particularly preferred because they are high in dimensional stability and low in price. Polyethylene terephthalate film is also preferred as plate material for small offset printing. When the absorbance of a transparent substrate is to be determined, the printing plate is place on white paper, and measurement is taken from above with a densitometer.

A directly imageable planographic printing plate precursor of the invention should preferably contain a heat insulating layer to prevent the heat from the laser beam applied from being released through the substrate. A primer layer, which is conventionally used to enhance the adhesion between the substrate and the ink-accepting layer (thermo-sensitive layer), may be used for this purpose.

When a heat insulating layer is used in a the directly imageable planographic printing plate precursor of the invention, such a insulating layer should meet the following requirements: to produce adhesion between the aluminum substrate and the ink-accepting layer (thermo-sensitive layer) that is strong enough and stable for a long period of time, and to be highly resistant to the solvents used for development and printing.

Materials that meet the requirements include epoxy resin, polyurethane resin, phenol resin, acrylic resin, alkyd resin, polyester resin, polyamide resin, urea resin, polyvinyl resin, polyvinyl butyral resin, casein-containing material, and gelatin-containing material, of which preferred ones include polyurethane resin, polyester resin, acrylic resin, epoxy resin, and urea resin, which may be used singly or in combination.

The thickness of such a heat insulating layer, in the form of coated film, should be 0.5 $g/m^2$ to 50 $g/m^2$, preferably 1 $g/m^2$ to 10 $g/m^2$. If it is not less than 0.5 $g/m^2$, the layer can prevent the formation of morphological defects on the substrate surface and protect the substrate from adverse chemical effect. A heat insulating layer with a thickness of not more than 50 $g/m^2$ is advantageous from an economic viewpoint.

A directly imageable planographic printing plate precursor of the invention may be laminated with protection film or covered with a protection layer to protect the ink-repelling layer. Preferred film materials include polyester, polypropylene, polyvinyl alcohol, sapoinified copolymer of ethylene and vinyl acetate, and polyvinylidene chloride.

The production method for directly imageable planographic printing plate precursor of the invention is as follows: a conventional coater such as reverse-roll coater, air-knife coater, gravure coater, dye coater, or meyer bar coater, or a rotary type coater such as wheeler, is used to coat the substrate with a composition for heat insulating layer as necessary, which is then heated at 100° C. to 300° C. for a few minutes or irradiated with active light for curing, followed by applying a composition for ink-accepting layer and heating/drying at 50° C. to 180° C. for a few tens of seconds to a few minutes as necessary to ensure curing.

Subsequently, a silicone rubber composition is applied and heat-treated at 50° C. to 200° C. for several minutes to produce a silicone rubber layer. Then the layer is laminated with a protection film or covered with a protection layer as necessary.

The production method for the directly imageable planographic printing plate of the invention is described in detail below.

The production method for the directly imageable planographic printing plate of the invention comprises a process for reacting the thermo-sensitive layer by laser beam irradiation directly after peeling off the protection film, or through the protection film, and another process for removing the ink-repelling layer by brushing in the presence of water while leaving the laser-irradiated thermo-sensitive layer unremoved.

A laser in the wavelength range of 300 nm to 1500 nm is used for the laser beam irradiation. The use of a semiconductor laser or a YAG laser in the near infrared range is preferred in the viewpoint of handling of the plate materials in a light room. Specifically, a laser with a wavelength of 780nm, 830nm, or 1064nm is preferred.

When irradiated with laser beam, the infrared-absorbing dye in the thermo-sensitive layer absorb laser beam to generate heat. If the transmittance of the thermo-sensitive layer is low, laser beam will be absorbed heavily near the surface of the thermo-sensitive layer, resulting in higher temperatures near the surface of the thermo-sensitive layer.

Thus, reaction can be limited to portions near the surface of the thermo-sensitive layer by controlling the dose of laser beam. The dose of laser beam should preferably be in the range of 100 $mJ/cm^2$ to 500 $mJ/cm^2$.

After being irradiated with laser beam, the printing plate precursor is treated with an organic solvent as necessary to dissolve or swell the surface of the thermo-sensitive layer, followed by brushing in the presence of water to ensure development.

The organic solvent used above should be a glycol compound or a glycol ether compound of the following general formula (II):

$R^3O—(CHR^2—CH_2—O—)_nR^4$ (II)

where $R^2$ denotes a hydrogen atom or an alkyl group with 1–5 carbons, $R^3$ and $R^4$ denoting a hydrogen atom or an alkyl group with 1–15 carbons, and n denoting an integer of 1 to 12.

Compounds that are particularly preferred include diethylene glycol, triethylene glycol, tetraethylene glycol, dipropylene glycol, tripropylene glycol, tetrapropylene glycol, polyoxypropylene glycol (Mw:200), polyoxypropylene glycol mono butyl ether (Mw:1200), tetraethylene glycol mono-2-ethyl-hexyl ether, and diethylene glycol mono-2-ethyl-hexyl ether.

Such processing solvent as listed above should contain alkali or amine compounds. Preferred compounds include diethylene glycol amine, N-(β-aminoethyl) aminoethanol, diethanolamine, N-methyldiethanolamine, morpholine, N-methylmorpholine, and N-(3-aminopropyl) morpholine. The content of these amine compounds in such processing solvents should be 0.1 wt % to 30 wt %, preferably 0.5 wt % to 20 wt %.

Furthermore, such processing solvents may contain water, alcohols, carboxylic acids, and surface active agents, as necessary.

Such processing solvents serves to dissolve or swell the thermo-sensitive layer in the laser-irradiated portion, but the temperature of said processing solvent should be maintained constant to ensure stable dissolution and swelling. Depending on the processing time, the optimum temperature range may be 10° C. to 50° C., preferably 35° C. to 45° C., from the viewpoint of the easiness of maintaining the temperature.

Said development process may be performed manually, but should preferably be carried out an automatic developing machine for waterless planographic printing plate such as Toray Industries, Inc., TWL-1160, TWL-650, and TWL-860, and other apparatus disclosed in Japanese Patent No.2864907, Japanese Patent Publication JP-A-hei-6-258842, Japanese Patent Publication JP-A-hei-6-258843, Japanese Patent Publication JP-A-hei-6-258844, and Japanese Patent Publication JP-A-hei-7-92692.

For brushing, a typical brush consists of arrays of brush bristles with a diameter of 20 μm to 500 μm that are fitted into grooves provided on a metal or plastic body. A brush may consist of bristles fitted in radial directions on a metal or plastic body, or bristles fitted over a plastic or fabric sheet, which is then wound around a metal or plastic body.

A brush to be used should preferably comprise bristles of at least one material selected from the following: polyvinyl chloride, polyamide, polyethylene terephthalate, polybutylene terephthalate, and polypropylene. Such a brush will not damage the ink-repelling layer in the printing plate and will be able to exert a sufficient force for complete removal of the ink-repelling layer from the laser-irradiated portion.

The number of revolutions of the brush roller used should be in the range of 10 rpm to 1000 rpm, preferably 200 rpm to 600 rpm. The ink-repelling layer in the laser-irradiated portion can be removed more effectively if the brush roller reciprocates in the axial direction while rotating. For complete removal of the ink-repelling layer from the laser-irradiated portion, it is important to provide several brush rollers some of which rotate in the same direction with the printing plate being conveyed while the others rotate in the opposite direction.

Instead of such developing systems as described above which comprises laser irradiation, organic solvent treatment, and brushing in the presence the water, a "water developing system" is also preferred in which organic solvent treatment is not performed, but the laser-irradiated printing plate is developed only brushing in the presence of water.

A directly imageable planographic printing plate is finished by dyeing it with a dye as described above.

The silicone rubber layer in the non-printing area can become likely to be peeled in a long period of time if the processing solvent or dyeing solution are retained in the dyed plate. Thus a rinsing process may be provided to remove said processing solvent or dyeing solution completely from the plate. The temperature of the rinsing water may be set appropriately for each case, but should preferably be in the range of 10° C. to 50° C.

The invention is illustrated more in detail below by using examples.

EXAMPLE 1

A solution with the composition described below was applied over a degreased aluminum plate with a thickness of 0.24 mm, which was then dried at 200° C. for 2 minutes to produce a heat insulating layer of 3 g/m$^2$.

<Composition of Heat Insulating Layer (Solid Content: 19.6 Parts by Weight)>

(1) Epoxy phenol resin ("Kancoat" 90T-25-3094, Kansai Paint Co., Ltd.): 15 parts by weight

[Composition of Solvent]

(1) Dimethylformamide: 85 parts by Weight

Over the heat insulating layer, a thermo-sensitive layer as described below was formed up to a dry film thickness of 1.0 g/m$^2$. Heat treatment was performed at 140° C. for 1 minute.

<Thermo-sensitive Layer 1>

(1) (3-Butyl-1,1-dimetyl-2-[2[2-diphenylamino-3-[(3-butyl-1,3-dihydro-1,1-dimetyl-2H-benzindole-2-ylidene) etylidene]-1-cyclopenten-1-yl]ethynyl]-1H-benzindolium perchlorate):15parts by weight (2) iron (III) acetylacetonate (Nakarai Chemical, Ltd.): 10 parts by weight (3) resol resin ("Sumirac" PC-1, Sumitomo Durez Co., Ltd.): 75 parts by weight (4) tetrahydrofuran: 100 parts by weight (5) dimethylformamide: 100 parts by weight (6) methyl ethyl ketone: 700 parts by weight Then, a silicone rubber layer as described below was formed up to a dry film thickness of 2.0 g/m$^2$. Drying (wet heat drying) was performed at 120° C. for 1 minute.

<Silicone Rubber Layer 1>

(1) polydimethylsiloxane (Molecular weight approx. 50,000, hydroxyl at both ends): 100 parts by weight (2) (methyl ethyl ketone oxime)silane (Vinyltris): 8 parts by weight (3) dibutyl tin diacetate: 0.5 part by weight (4) 3-aminopropyltriethoxysilane: 0.5 part by weight (5) isoparaffin-based hydrocarbon ("Isopar" E, Exxon Chemical Japan LTD): 1400 parts by weight A multi-layered plate is laminated with a protection film (polypropylene, 8 μm thick) with a calender roller to produce a directly imageable waterless planographic printing plate precursor.

This planographic printing plate precursor is fitted to a plate-making machine (FX400-AP, Toray Engineering Co., Ltd.), and irradiated with semiconductor laser beam (wavelength 830nm, beam diameter 20 μm) under the conditions of a exposure time of 10 ps and irradiation energy of 125 mJ/cm$^2$.

Then, the plate was immersed in pretreatment solution (NP-1, Toray Industries, Inc.) for negative-type waterless planographic plates, for 1 minutes, and developed by brushing with a piece of gauze ("Haize Gauze", Asahi Kasei Corporation), resulting the production of a negative-type waterless planographic plate which has lost the silicone rubber layer only from the laser-irradiated portion. Subsequently, dyeing was carried out by brushing the plate for 1 minute in a 25° C. nitrogen atmosphere with a piece of Haize Gauze containing a dyeing solution of the composition described below.

<Dyeing Solution>

(1) ethylcarbitol: 10 parts by weight
(2) water: 89.5 parts by weight
(3) Crystal Violet (absorption maximum at 592 nm): 0.5 part by weight After being rinsed in water for 1 minute, the dye plate obtained was subjected to absorbance measurement at 592 nm with a ultraviolet-visible region spectrophotometer (U-3210, Hitachi, Ltd.) provided with an integrating sphere. The absorbance of the non-printing area was 0.8 while the absorbance of the printing area was 1.5, giving an absorbance difference of 0.7. The printing and non-printing areas were distinguished easily by visual observation.

Comparative Example 1

A thermo-sensitive layer with the composition described below was applied over the heat insulating layer produced in Example 1. The dry film thickness was 1.0 g/m$^2$, and the heat treatment was performed at 140° C. for 1 minute.

<Thermo-sensitive Layer 2>

(1) polymethine compound ("IRT", Showa Denko K. K.): 15 parts by weight
(2) iron (III) acetylacetonate (Nakarai Chemical, Ltd.): 10 parts by weight
(3) "Sumirac" PC-1 (resol resin, Sumitomo Durez Co., Ltd.)): 75 parts by weight
(4) tetrahydrofuran: 100 parts by weight
(5) dimethylformamide: 100 parts by weight
(6) methyl ethyl ketone: 700 parts by weight A silicone rubber layer as described in Example 1 was formed over the plate, which was then laminated with protection film (polypropylene film 8 μm thickness) using a calender roller to produce a directly imageable waterless planographic printing plate precursor.

A dyed printing plate was produced by the same procedure as in Example 1. Its absorbance was measured by the same procedure as in Example 1, indicating that the absorbance of the non-printing area was 1.3 while the absorbance of the printing area was 1.5. Thus the difference in absorbance was 0.2. The printing and non-printing areas were not distinguished easily by visual observation.

EXAMPLE 2

<<Production of Directly Imageable Planographic Printing Plate Precursor>>

A solution with the composition described below was applied over a degreased aluminum plate with a thickness of 0.24 mm (Kobe Steel, Ltd.), followed by drying at 150° C. for 80 seconds to produce a thermo-sensitive layer with a thickness of 1.5 g/m$^2$.

<Thermo-sensitive Layer 3>

| | |
|---|---|
| (a) ("Projet" 825LDI, Avecia Limited) | 11 parts by weight |
| (b) acetylacetone solution of titanium di-n-butoxide (bis-2,4-pentanedionate ("Nasem Titan", Nippon Chemical Industrial Co., Ltd.): | 9 parts by weight |

-continued

| | |
|---|---|
| (solid content assumed at 40 wt % for calculation. 9 parts by weight as solid) | |
| (c) phenol novolak resin ("Sumi-light Resin" PR50622, Sumitomo Durez Co., Ltd.) | 60 parts by weight |
| (d) polyurethane ("Sanpren" T1331D, Sanyo Chemical Industries, Ltd.) (as solid 10 parts by weight) | 10 parts by weight |
| (e) m-xylylenediamine/glycidyl methacrylate/3-glycidoxypropyltrimethoxysilane 1/3/1 in mole ratio addition product | 10 parts by weight |
| (f) tetrahydrofuran | 700 parts by weight |
| (g) dimethylformamide | 100 parts by weight |
| (h) ethanol | 100 parts by weight |

Subsequently, a silicone rubber layer with the composition described below was applied with a slit dye coater, up to a dry film thickness of 2.0 μm, and dried at 125° C. for 2 minutes to produce directly imageable planographic printing plate precursor 3.

<Silicone Rubber Layer 2>

| | |
|---|---|
| (a) α, ω-divinyl polydimethylsiloxane (molecular weight: approx. 60,000) | 100 parts by weight |
| (b) (methyl hydrogen siloxane)(dimethyl siloxane) copolymer with methyl at both ends (HMS-501, Chisso Corporation, number of SiH groups per molecular weight 0.69 mol/g) | 7 parts by weight |
| (c) vinyltri (methyl ethyl ketoxime) silane | 3 parts by weight |
| (d) platinum catalyst (SRX-212, Dow Corning Toray Silicone Co., Ltd.) | 5 parts by weight |
| (e) "Isopar" E (Exxon Chemical Japan Ltd.) | 1000 parts by weight |

<<Production of Directly Imageable Planographic Printing Plate>>

The directly imageable planographic printing plate precursor produced above was fitted on Toray Industries, Inc., GX-3600 plate making machine, and irradiated with semiconductor laser with a wavelength of 830 nm (exposed doze 175 mJ/cm$^2$, 2400 dpi (dots per inch), 175 lpi (lines per inch)).

Then the directly imageable planographic printing plate was developed by using Toray Industries, Inc., TWL-860KII automatic planographic printing plate developing machine with the first, second, and third tanks containing processing solvent 1 as described below, water and processing solvent 2 as described below, respectively. Treatment with processing solvent 1 and processing solvent 2 was performed at 40° C. for 30 seconds, and at 25° C. for 15 seconds, respectively. Treatment with water in the second tank was carried out at 25° C. for 15 seconds.

In the first tank, the processing solvent was poured over the printing plate to dissolve or swell the surface of the thermo-sensitive layer.

| | |
|---|---|
| <Processing solvent 1> | |
| (a) diethylene glycol | 80 parts by weight |
| (b) diethylene glycol amine | 15 parts by weight |
| (c) 2-ethylhexyl sodium sulfate (anionic surface active agent, 40% aqueous solution | 1 part by weight |
| (d) water | 4 parts by weight |
| <Processing solvent 2> | |
| (a) butylcarbitol | 20 parts by weight |
| (b) 2-ethylhexane acid | 1 part by weight |

-continued

| | |
|---|---|
| (c) 2-ethylhexyl sodium sulfate (anionic surface active agent) | 0.5 part by weight |
| (d) dye (C.I. Basic Blue 7 CI42594) | 0.02 part by weight |
| (e) dye (C.I. Basic Blue 1 CI42095: maximum absorption at 599 nm) | 0.08 part by weight |
| (f) water | 78.4 parts by weight |

The processing solvent was removed from the printing plate as the plate is conveyed automatically from the first tank to the second tank. In the second tank, the printing plate was rubbed with a brush rotating in the same direction as the conveyance direction of the printing plate while being rinsed with water. In the third tank, the plate is rubbed with a brush rotating in the opposite direction.

The above procedure produced a directly imageable planographic printing plate which has lost the silicone rubber layer while maintaining the thermo-sensitive layer in the laser-irradiated portion. As in Example 1, the absorbance at 599 nm of the printing plate was measured, indicating that the absorbance of the non-printing area was 0.7 while the absorbance of the printing area was 1.3, with a difference in absorbance being 0.6.

<<Evaluation in Easiness of Plate Check 1>>

The easiness of plate check was evaluated based on observation of the resultant printing plate with a loupe with a magnification of 25. Halftone dots as small as 1% were observed clearly, indicating that the easiness of plate check was high.

<<Evaluation in Image Reproductivity>>

The resultant printing plate was fitted on Komori Corporation "Sprint" 25 sheet-feed offset press and used for printing on uncoated paper (62.5 kg/kiku [636×939 mm]) with Dainippon Ink and Chemicals, Inc., "Dry-O-Color" cyan blue waterless planographic printing ink. The prints were observed to determine the reproductivity, and a high reproductivity from 1 to 99% was confirmed.

<<Evaluation in Easiness of Plate Check 2>>

The printing plate used above for printing was detached from the press, and the printing plate with the ink unremoved was observed with loupe with a magnification of 25 to determine the easiness of plate check. Halftone dots as small as 1% were observed clearly, indicating that the easiness of plate check was high.

<<Observation of UV Spectrum of Printing Plate>>

UV spectrum of the directly imageable planographic printing plate precursor described above was observed by the reflection method with Hitachi, Ltd., U-3210 spectrophotometer with an integrating sphere.

The main peak was found at 750 nm, and the absorbance at 830 nm (A) and that at 650 nm (B) were 1.34 and 0.72, respectively, and their ratio (A/B) was 1.86.

The maximum absorbance in the range of 400 to 700 nm was 1.99, confirming that the maximum was less than 2.

Comparative Example 2

<<Production of Directly Imageable Planographic Printing Plate Precursor>>

A printing plate precursor was produced by the same procedure as in Example 2 except that the thermo-sensitive layer had a composition as described below.

<Thermo-sensitive Layer 4>

| | |
|---|---|
| (a) ("Kayasorb" PS101, Nippon Kayaku Co., Ltd.) | 11 parts by weight |
| (b) acetylacetone solution of titanium di-n-butoxide (bis-2,4-pentanedionate ("Nasem Titan", Nippon Chemical Industrial Co., Ltd.): (solid content assumed at 40 wt % for calculation. 9 parts by weight as solid) | 9 parts by weight |
| (c) phenol novolak resin ("Sumi-light Resin" PR50622, Sumitomo Durez Co., Ltd.) | 60 parts by weight |
| (d) polyurethane ("Sanpren" T1331D, Sanyo Chemical Industries, Ltd.) (as solid 10 parts by weight) | 10 parts by weight |
| (e) m-xylylenediamine/glycidyl methacrylate/3-glycidoxypropyltrimethoxysilane 1/3/1 in mole ratio addition product | 10 parts by weight |
| (f) tetrahydrofuran | 800 parts by weight |
| (g) dimethylformamide | 100 parts by weight |

Evaluation was carried out as in Example 2. For the prints obtained, a good image productivity of 1–99% was confirmed, but for the printing plate, only halftone dots down to 4% were confirmed. For the ink-holding printing plate, only halftone dots down to 3% were confirmed.

UV spectrum observation showed that the main peak was at 810 nm, and the absorbance at 830 nm (A) and that at 650 nm (B) were 1.76 and 1.62, respectively, and their ratio (A/B) was 1.09, i.e. a value less than 1.5.

The absorbance at 599 nm of the printing plate was measured as in Example 1, indicating that the absorbance of the non-printing area was 1.6 while that of the printing area was 1.7, with the difference in absorbance being 0.1. Easiness of plate check was evaluated as in Example 2, but it was difficult to distinguish the printing area and the non-printing area.

EXAMPLE 3

<<Production of Directly Imageable Planographic Printing Plate Precursor>>

A solution with the composition described below was applied with a bar coater over a 50 $\mu$m thick polyethylene terephthalate film ("Lumirror" T150, Toray Industries, Inc.), and dried at 150° C. for 80 seconds to produce a thermo-sensitive layer of 1.5 g/m$^2$.

<Thermo-sensitive Layer 5>

| | |
|---|---|
| (a) (IR2T, Showa Denko K. K.) | 11 parts by weight |
| (b) acetylacetone solution of titanium di-n-butoxide (bis-2,4-pentanedionate ("Nasem Titan", Nippon Chemical Industrial Co., Ltd.): (solid content assumed at 40 wt % for calculation. 9 parts by weight as solid) | 9 parts by weight |
| (c) phenol novolak resin ("Sumi-light Resin" PR50622, Sumitomo Durez Co., Ltd.) | 60 parts by weight |
| (d) polyurethane ("Sanpren" T1331D, Sanyo Chemical Industries, Ltd.) (as solid 10 parts by weight) | 10 parts by weight |
| (e) m-xylylenediamine/glycidyl methacrylate/3-glycidoxypropyltrimethoxysilane 1/3/lin mole ratio addition product | 10 parts by weight |
| (f) tetrahydrofuran | 800 parts by weight |
| (g) dimethylformamide | 100 parts by weight |

Subsequently, a silicone rubber layer with the composition described below was applied with a bar coater, up to a dry film thickness of 2.0 $\mu$m, and dried at 125° C. for 2 minutes to produce directly imageable planographic printing plate precursor.

<Silicone Rubber Layer 1>

| | |
|---|---|
| (a) α, ω-divinyl polydimethylsiloxane (molecular weight: approx. 60,000) | 100 parts by weight |
| (b) (methyl hydrogen siloxane)(dimethyl siloxane) copolymer with methyl at both ends (HMS-501, Chisso Corporation, number of SiH groups per molecular weight 0.69 mol/g) | 7 parts by weight |
| (c) vinyltri (methyl ethyl ketoxime) silane | 3 parts by weight |
| (d) platinum catalyst (SRX-212, Dow Corning Toray Silicone Co., Ltd.) | 5 parts by weight |
| (e) “Isopar” E (Exxon Chemical Japan Ltd.) | 1000 parts by weight |

The directly imageable planographic printing plate precursor produced above was irradiated with laser beam as in Example 2, stuck to a 0.15 mm thick aluminum plate, and developed as in Example 2 to produce a directly imageable planographic printing plate.

Evaluation was carried out as in Example 2. The image reproductivity for prints was 1.99%, and the easiness of plate check for the as-produced print and ink-holding plate was not less than 1% for both cases. Thus good results were obtained. The absorbance at 599 nm of the printing plate was measured, indicating that the absorbance of the non-printing area was 0.3 while that of the printing area was 1.2, with the difference in absorbance being 0.9. The printing area and the non-printing area were distinguished easily.

<<Observation of UV Spectrum of Printing Plate Precursor>>

UV spectrum of the directly imageable planographic printing plate precursor described above was observed by the transmission method.

The main peak was found at 858 nm, and the ratio A/B of the absorbance at 830 nm (A) to that at 650 nm (B) was 12.6. The maximum absorbance in the range of 400 to 700 nm was 0.31, confirming that the maximum was less than 2.

Comparative Example 3

A printing plate precursor was produced by the same procedure as in Example 3 except that “Kayasorb” IR820 (B) (Nippon Kayaku Co., Ltd.) was used as component (a) of the thermo-sensitive layer.

Evaluation was carried out as in Example 3. For the prints obtained, a good image productivity from 1–99% was confirmed, but for the printing plate, only halftone dots down to 4% were confirmed. For the ink-holding printing plate, only halftone dots down to 3% were confirmed. The absorbance at 599 nm of the printing plate was measured as in Example 1. The absorbance of the printing area and that of the non-printing area was 1.2 and 1.4, respectively, with the difference in absorbance being 0.2. It was impossible to distinguish the printing area and the non-printing area.

UV spectrum was observed by the transmission method. The main peak was found at 838 nm, and the ratio A/B of the absorbance at 830 nm (A) to that at 650 nm (B) was 2.48, i.e. a value below 3.0. The maximum absorbance in the range of 400 nm to 700 nm was 1.29, confirming that the maximum was less than 2.

EXAMPLE 4

A directly imageable planographic printing plate precursor was produced by the same procedure as in Example 2 except that component (a) of the thermo-sensitive layer was as shown in Table 1, followed by laser irradiation and development as in Example 2.

The absorption properties were measured by the reflection method. The main peak was found at 810 nm, and the ratio A/B of the absorbance at 830 nm (A) to that at 650 nm (B) was 4.11, i.e. a value above 1.5. The maximum absorbance in the range of 400 to 700 nm was 0.31, confirming that the maximum was less than 2. The absorbance at 599 nm of this printing plate was measured as in Example 1. The absorbance of the non-printing area and that of the printing area was 1.0 and 1.4, respectively, with the difference in absorbance being 0.4.

Good results were obtained for image reproductivity, easiness of plate check, and easiness of check for an ink-holding plate (Table 2).

TABLE 1

| | Thermo-sensitive layer (a) | Absorbance A/B | Absorbance λmax (400–700) |
|---|---|---|---|
| Example 2 | “PROJET” 825LDI (Avecia Limited) main peak: 750 nm | 1.86 | 1.99 |
| Example 4 | Dye 17 main peak: 810 nm | 4.11 | 1.01 |
| Comparative example 2 | “KAYASORB” PS101 (Nippon Kayaku Co., Ltd.) main peak: 810 nm | 1.09 | 1.62 |

TABLE 2

| | Plate check easiness 1 (plate observation) | Plate check easiness 2 (ink-holding plate) | Image reproduct-ivity (prints) |
|---|---|---|---|
| Example 2 | more than 1% | more than 1% | 1–99% |
| Example 4 | more than 1% | more than 1% | 1–99% |
| Comparative example 2 | 4% | 3% | 1–99% |

(Dye 17)

(Dye 17)

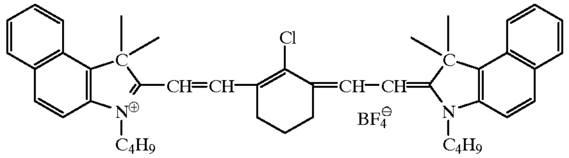

EXAMPLES 5–9

A directly imageable planographic printing plate precursor was produced by the same procedure as in Example 3 except that component (a) of the thermo-sensitive layer was as shown in Table 3, followed by laser irradiation and development as in Example 3.

In each of the examples, the absorption properties were measured by the transmission method. The ratio A/B of the absorbance at 830 nm (A) to that at 650 nm (B) was above 3.0. The maximum absorbance in the range of 400 nm to 700 nm was less than 2.

Good results were obtained for image reproductivity, easiness of plate check, and easiness of check for an ink-holding plate (Table 4). The absorbance at 599 nm of the printing plate was measured as in Example 1. The difference in absorbance between the non-printing area and the printing area was above 0.3 in all examples (Table 5).

TABLE 3

| | Thermo-sensitive | Absorbance | |
|---|---|---|---|
| | layer (a) | A/B | λmax (400–700) |
| Example 3 | IR2T (Showa Denko K. K.) main peak: 858 nm | 12.6 | 0.31 |
| Example 5 | "PROJET" 825LDI (Avecia Limited) main peak: 798 nm | 8.4 | 1.17 |
| Example 6 | "KAYASORB" CY10 (Nippon Kayaku Co., Ltd.) main peak: 802 nm | 7.3 | 1.04 |
| Example 7 | "KAYASORB" CY5 (Nippon Kayaku Co., Ltd.) main peak: 810 nm | 5.7 | 1.05 |
| Example 8 | Dye 9 main peak: 815 nm | 11.6 | 0.12 |
| Example 9 | YKR-3070 (Yamamoto Chemicals Inc.) main peak: 828 nm | 7.6 | 0.30 |
| Comparative example 3 | "KAYASORB" IR820(B) (Nippon Kayaku Co., Ltd.) main peak: 838 nm | 2.5 | 1.29 |

TABLE 4

| | Plate check easiness 1 (plate observation) | Plate check easiness 2 (ink-holding plate) | Image reproduct-ivity (prints) |
|---|---|---|---|
| Example 3 | more than 1% | more than 1% | 1–99% |
| Example 5 | more than 1% | more than 1% | 1–99% |
| Example 6 | more than 1% | more than 1% | 1–99% |
| Example 7 | more than 1% | more than 1% | 1–99% |
| Example 8 | more than 1% | more than 1% | 1–99% |
| Example 9 | more than 1% | more than 1% | 1–99% |
| Comparative Example 3 | 4% | 3% | 1–99% |

TABLE 5

| | Absorbance of the non-printing area | Absorbance of the printing area | Absorbance difference between printing and non-printing areas |
|---|---|---|---|
| Example 3 | 0.3 | 1.2 | 0.9 |
| Example 5 | 1.1 | 1.5 | 0.4 |
| Example 6 | 1.0 | 1.3 | 0.3 |
| Example 7 | 1.0 | 1.4 | 0.4 |
| Example 8 | 0.1 | 1.2 | 1.1 |
| Example 9 | 0.3 | 1.3 | 1.0 |
| Comparative example 3 | 1.2 | 1.4 | 0.2 |

(Dye 9)

(Dye 9)

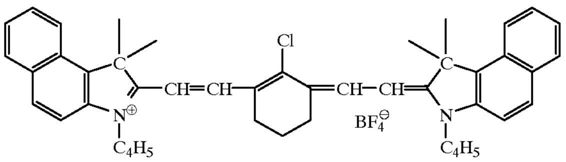

EXAMPLE 10

<Production of Directly Imageable Planographic Printing Plate Precursor>

A solution with the composition described below was applied over a degreased aluminum plate with a thickness of 0.24 mm (Kobe Steel, Ltd.), followed by drying at 150° C. for 80 seconds to produce a thermo-sensitive layer with a thickness of 1.5 g/$m^2$.

<Thermo-sensitive Layer>

| | |
|---|---|
| (a) (YKR-2900, Yamamoto Chemicals Inc.) | 11 parts by weight |
| (b) acetylacetone solution of titanium di-n-butoxide(bis-2,4-pentanedionate (AKT853, Gelest Inc.) | 9 parts by weight |
| (solid content assumed at 40 wt % for calculation. as solid) | 9 parts by weight |
| (c) phenol novolak resin ("Sumi-light Resin" PR50622, Sumitomo Durez Co., Ltd.) | 60 parts by weight |
| (d) polyurethane ("Sanpren" T1331D, Sanyo Chemical Industries, Ltd.) | 10 parts by weight (as solid 10 parts by weight) |
| (e) m-xylylenediamine/glycidyl methacrylate/3-glycidoxypropyltrimethoxysilane 1/3/lin mole ratio addition product: | 10 parts by weight |
| (f) tetrahydrofuran | 800 parts by weight |
| (g) dimethylformamide | 100 parts by weight |

Subsequently, a silicone rubber layer with the composition described below was applied with a slit dye coater, up to a dry film thickness of 2.0 μm, and dried at 125° C. for 2 minutes to produce directly imageable planographic printing plate precursor.

<Silicone Rubber Layer>

| | |
|---|---|
| (a) α,ω-divinyl polydimethylsiloxane 1 (weight-average molecular weight (Mw): 131,000, variance (Mw/Mn): 5.24): | 100 parts by weight |
| (b) (methyl hydrogen siloxane)(dimethyl siloxane)copolymer with methyl at both ends (HMS-151, Gelest Inc., MeSiH 15–18 mol %) | 4 parts by weight |
| (c) vinyltri (methyl ethyl ketoxime)silane | 3 parts by weight |
| (d) platinum catalyst (SRX-212, Dow Corning Toray Silicone Co., Ltd.) | 5 parts by weight |
| (e) ("Isopar" E, Exxon Chemical Japan Ltd.) | 1035 parts by weight |

Laser irradiation, development, and evaluation were carried out as in Example 2. For both prints and printing plate, a good image productivity for 1–99% halftone dots was confirmed. The absorbance at 599 nm of the printing plate was measured as in Example 1. The absorbance of the printing area and that of the non-printing area was 0.4 and 1.3, respectively, with the difference in absorbance being 0.9.

Then, the silicone rubber layer in the non-printing area was swollen with "Isopar" E and observed. No flaws associated with the brushing in the automatic developing machine were found.

UV spectrum was observed. The main peak was found at 810 nm, and the absorbance at 830 nm and that at 650 nm were 1.67 and 0.41, respectively, giving a A/B ratio of 4.11, i.e. a value above 1.5.

[Measurement of Molecular Weight Distribution by Gel Permeation Chromatography]

GPC measurement of molecular weight distribution of vinylpolydimethylsiloxane was carried out under the following conditions.

Equipment: gel permeation chromatograph (GPC-224, Waters) (LS1) Data processing: GPC data processing system (Toray Research Center, Inc.)

Column: TSK-gel-GMHx1 (inner dismeter 7.8 mm, length 30 cm) (2 columns used), (Tosoh Corporation)

Solvent: toluen

Flow rate: 1.0 ml/min

Sample: concentration—0.3% solubility—100% filter—My Shori Disk H-13-5

Injected volume: 200 μl

Detector: differential refractometer (401, Waters)

Molecular weight calibration: 10 monodisperse polystyrene products (Tosoh Corporation)

| | |
|---|---|
| 1. F-288-01 molecular weight (M) | 2,890,000 |
| 2. F-80-0 | 706,000 |
| 3. F-40-01 | 355,000 |
| 4. F-20-01 | 190,000 |
| 5. F-10-01 | 96,400 |
| 6. F-4-01 | 37,900 |
| 7. F-2-01 | 18,100 |
| 8. A-5000-01 | 5,970 |
| 9. A-2500-01 | 2,630 |
| 10. A-500-01 | 500 |

Industrial Applicability

The present invention provides directly imageable planographic printing plates that are high in image productivity and easy to check.

What is claimed is:

1. A method of producing a directly imageable planographic printing plate that comprises;

applying laser beam to a directly imageable planographic printing plate precursor comprising at least a substrate, a thermo-sensitive layer and a ink-repelling layer in this order, removing the ink-repelling layer from the laser-irradiated portion, and dyeing, with a dyeing solution, of the printing area which is free of said ink-repelling layer, wherein the difference between the reflected absorption of the non-printing area which holds the ink-repelling layer and the reflected absorption of said printing area, observed after dyeing of the printing plate at the absorption maximum wavelength of the dye in said dyeing solution, is not less than 0.3 and not more than 2.0, and wherein an ultraviolet absorption spectrum of said directly imageable planographic printing plate precursor, observed by the transmission method, has the following features:

(1) the main peak in the ultraviolet absorption spectrum exists between 700 nm and 1,200 nm, and (2) the ratio A/B of the absorbance at 830 nm (A) to the absorbance at 650 nm (B) is not less than 3.0.

2. A method of producing a directly imageable planographic printing plate according to claim 1, wherein the absorption maximum wavelength of said dye exists in the range of 500 nm to 650 nm.

3. A method of producing a directly imageable planographic printing plate according to claim 1, wherein the maximum absorbance of said directly imageable planographic printing plate precursor in the wavelength range of 400 nm to 700 nm is not more than 2.

4. A method of producing a directly imageable planographic printing plate according to claim 1, wherein the ink-repelling layer is a silicone rubber layer.

5. A directly imageable planographic printing plate precurser comprising at least a substrate, a thermo-sensitive layer and a ink-repelling layer in this order, wherein the ultraviolet absorption spectrum observed by the transmission method has the following features:

(1) the main peak in the ultraviolet absorption spectrum exists between 700 nm and 1,200 nm, and (2) the ratio A/B of the absorbance at 830 nm (A) to the absorbance at 650 nm (B) is not less than 3.0.

6. A directly imageable planographic printing plate precursor according to claim 5, whose maximum absorbance in the wavelength range of 400–700 nm is not more than 2.

7. A directly imageable planographic printing plate precursor according to claim 5, wherein the ink-repelling layer is a silicone rubber layer.

8. A directly imageable planographic printing plate comprising at least a substrate, a thermo-sensitive layer and a ink-repelling layer in this order, wherein the ultraviolet absorption spectrum observed by the transmission method has the follow features:

(1) the main peak in the ultraviolet absorption spectrum exists between 700 nm and 1,200 nm, and (2) the ratio A/B of the absorbance at 830 nm (A) to the absorbance at 650 nm (B) is not less than 3.0.

9. A directly imageable planographic printing plate according to claim 8, whose maximum absorbance in the wavelength range of 400 nm to 700 nm is not more than 2.

10. A directly imageable planographic printing plate according to claim 8, wherein the ink-repelling layer is a silicone rubber layer.

11. A directly imageable planographic printing plate comprising at least a substrate, a thermo-sensitive layer and a ink-repelling layer in this order, wherein the thermo-sensitive layer in the printing area contains a dye that has an absorption maximum in the range of 400 nm to 700 nm, and the difference between the reflected absorption of the non-printing area and the reflected absorption of the printing area, observed at the absorption maximum wavelength of the dye, is not less than 0.3 and not more than 2.0, and wherein an ultraviolet absorption spectrum of said directly imageable planographic printing plate precursor, observed by the transmission method, has the following features:

(1) the main peak in the ultraviolet absorption spectrum exists between 700 nm and 1,200 nm, and (2) the ratio A/B of the absorbance at 830 nm (A) to the absorbance at 650 run (B) is not less than 3.0.

12. A directly imageable planographic printing plate according to claim 11, wherein the absorption maximum wavelength of said dye exists in the range of 500 nm to 650 nm.

13. A directly imageable planographic printing plate according to claim 11, wherein the ink-repelling layer is a silicone rubber layer.

* * * * *